Nov. 10, 1959 L. M. LEEDS 2,912,651

AUTOMATIC FREQUENCY CONTROL

Filed March 29, 1954

INVENTOR:
LAURANCE M. LEEDS,

BY Julius J. Zaskalicky
HIS ATTORNEY.

United States Patent Office 2,912,651
Patented Nov. 10, 1959

2,912,651

AUTOMATIC FREQUENCY CONTROL

Laurance M. Leeds, Syracuse, N.Y., assignor to General Electric Company, a corporation of New York Application March 29, 1954, Serial No. 419,260
18 Claims. (Cl. 331—17)

Figure 1:
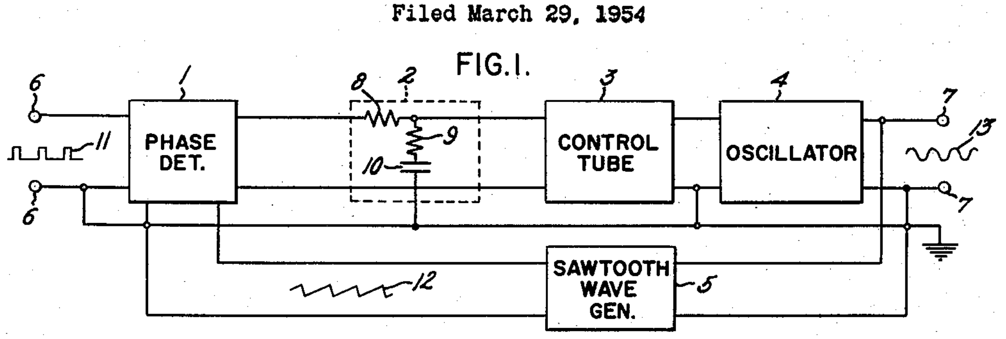

The present invention relates to frequency control systems and has as an object thereof to provide in an automatic frequency control system, a novel control network or voltage filtering arrangement for the improvement of the frequency control characteristics of such systems.

The filtering arrangement here disclosed permits the frequency control system to have not only a large frequency range through which synchronization will occur, but also substantial stability and immunity to random noise peaks. In frequency control systems of the type in which an oscillator is synchronized in phase or frequency with a remote signal in accordance with a direct current control voltage supplied by a discriminator or phase detector, the control voltage may contain noise pulses arising in transmission of the remote signal which tend to disturb the stability of the system. The usual method of reducing the effect of these noise pulses is to pass the control voltage through a control network in which the relatively high frequency noise peaks are dissipated. This measure may only be used to limited extent, however, because each increase in the stability and noise immunity is achieved at the cost of a diminution in the frequency range through which synchronization can be effected. This interdependence between control range and stability follows from the fact that the noise pulses contain substantial high frequency energy as does the control voltage produced when a substantial error exists between the frequency standard and the controlled oscillator. Consequently, the interposition of a control network which eliminates the high frequency noise pulses also has the effect of reducing the effectiveness of the higher frequency error voltage in achieving a correction of the oscillator frequency. In the present invention means are disclosed for providing a control network arrangement in which this conflict in requirements is avoided so as to permit the frequency control system to have both a wide frequency synchronization range and high stability.

Accordingly, it is another object of the present invention to provide an improved control network arrangement for the control voltage developed in a frequency control system.

It is a further object of the present invention to provide an improved control network arrangement for the control voltage developed in a frequency and phase control system.

It is still another object of the present invention to provide a control network arrangement for the control voltage developed in an automatic frequency control system which permits a substantial range of frequency correction during the synchronization period while permitting highly stable, noise-free operation.

These and other objects are achieved by the present invention, in a frequency control system in which tuning of an oscillator is achieved by use of a control voltage corresponding to the degree of detuning of the oscillator, which voltage may contain undesired voltage variations such as noise pulses, by the provision of a filter or control network for substantially eliminating said undesired voltage variations from said error voltage and means for reducing the effectiveness of said filter during the period that the oscillator is being brought into tune.

Figure 2:
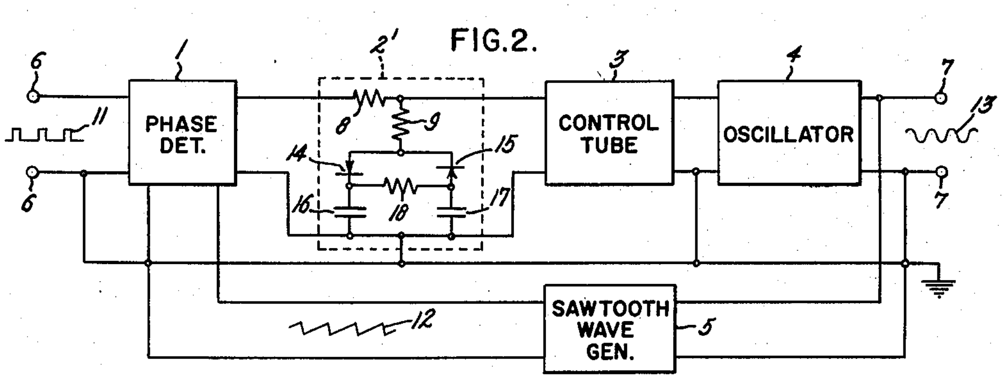
Figure 3:
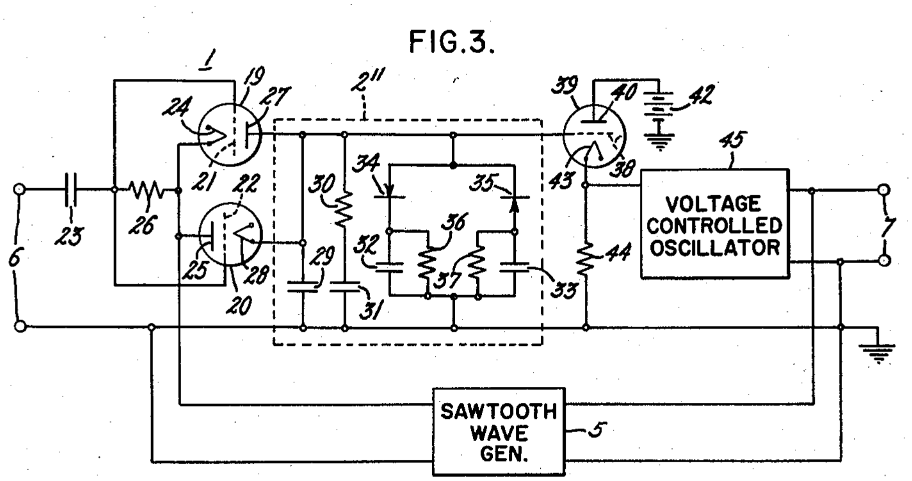

The novel features which are believed to be characteristic of the invention are set forth with particularity in the appended claims. The invention itself, however, both as to its organization and method of operation, together with further objects and advantages thereof, may best be understood by reference to the following description taken in connection with the accompanying drawings in which:

Figure 1 illustrates in modified block diagram, a known type of frequency control system useful in explaining the operation of the invention, Figure 2 illustrates in modified block diagram, a frequency control system incorporating a first embodiment of the invention, Figure 3 illustrates in modified schematic diagram, a frequency control system incorporating a second embodiment of the invention.

Referring now to Figure 1, there is shown a known frequency control system suitable for synchronizing the horizontal sweep oscillator of a television receiver with remotely transmitted line scansion or horizontal synchronizing pulses. The frequency control system has as its principal components, a phase detector 1, a control network 2, a control tube 3, an oscillator 4, and a sawtooth wave generator 5. Suitable input terminals 6 are provided, connected to one pair of radio frequency input terminals of the phase detector 1. The terminals 6 serve for connection to a source of external synchronizing signals.

The resistors 8 and 9 and capacitor 10, provide the principal elements of the control network 2. The ungrounded output terminal of the phase detector is connected to one terminal of the resistor 8, which serves as the input terminal for control network 2. The other terminal of resistor 8 furnishing the output of the control network 2 is connected to the control voltage input of the control tube 3. A resistor 9 and a capacitor 10 are connected in series between the other said terminal of the resistor 8 and the grounded terminal of control network 2, respectively. The control tube 3 may be a reactance tube, whose reactance output is coupled to the oscillator 4 in a portion of its frequency determining resonant circuit (the resonant circuit not being shown). The output terminals of the oscillator 4 are connected to the main output terminals 7 and to the wave timing input of a sawtooth wave generator 5. The output of the sawtooth wave generator is connected to another radio frequency input terminal of the phase detector 1. As illustrated, one of each pair of terminals of the principal circuit components may be joined together and connected to a common ground.

The operation of the frequency control system of Figure 1 is as follows. Horizontal synchronization pulses shown at 11 are supplied to the input terminal 6 and coupled to the first radio frequency input of the phase detector 1. The aforementioned rectangular pulses are compared in the phase detector 1 with sawtooth oscillations shown at 12 supplied by the sawtooth wave generator 5 to the other radio frequency input of the phase detector 1. The phase detector 1 develops a direct current potential at its output whose magnitude and sign is dependent on the difference in phase between the two applied signals. This output voltage is then applied to the input terminals of the control network 2. After passage through the control network 2, the direct current control voltage is applied to control the effective reactance supplied by the control tube 3 to the oscillator tank circuit and thereby control the frequency and the phase of the oscillator. A portion of the oscillator output is fed to control the timing of a sawtooth wave generator 5, which generator, as mentioned above, is coupled to the phase detector input and supplies thereto a sawtooth wave in synchronism with the oscillations shown at 13 appearing in the output of the oscillator 4.

The phase detector 1 may take any of several known forms. In the present arrangement and in subsequent embodiments of the invention, a phase detector is employed which is adapted to compare the phase of a short duration rectangular pulse with a sawtooth wave or sine wave and develop a direct current voltage indicative of the phase separation between these waves. The direct current voltage developed by the phase detector when so employed contains components of respectively sawtooth or sine wave shape, this wave shape being characterized by a relatively high energy content and having a repetition frequency equal to the momentary difference in frequency between the two waves applied to the phase detector.

The control network 2 is preferably of the type known as the "Proportional-Plus Integral Control Network" described in "Principles of Servo Mechanism," by J. S. Brown and D. P. Campbell, John Wiley & Sons, New York, 1948. The combination of this type of control network with the frequency control system of Figure 1 results in the system as a whole acting as a low pass filter which greatly attenuates high frequency components and provides an increase in the stability of operation of the system and a corresponding reduction in its sensitivity to random noise.

A frequency control system embodying the invention is illustrated in Figure 2. Elements which are illustrated in both Figures 1 and 2, bear the same reference numerals, and it should be understood that the description of the characteristics and operation of the elements of the frequency control system of Figure 1 is generally applicable to the corresponding elements illustrated in Figure 2 with the exception of the novel control network shown at 2′, which will now be described.

The filter network 2′ comprises a series resistor 8 whose terminals are connected respectively to the ungrounded input and ungrounded output terminals of the control network, and a shunt circuit across the output terminals of the network 2′ comprising a resistor 9, a pair of rectifiers 14 and 15, a pair of capacitors 16 and 17, and a resistor 18. The capacitor 16 has one terminal connected to the negative terminal of the rectifier 14. The capacitor 17 has one terminal connected to the positive terminal of the rectifier 15. A resistor 18 is connected between these last-named junctions, and the two remaining terminals of the capacitors 16 and 17 are connected together and to the grounded terminals of the control network. The positive terminal of rectifier 14 and the negative terminal of rectifier 15 are joined and connected to one terminal of resistor 9. The other terminal of resistor 9 is connected to the ungrounded output terminal of the control network 2′.

By virtue of the novel control network 2′, the frequency control system illustrated in Figure 2 exhibits high stability in the presence of undesired noise pulses in the phase detector output while possessing the ability to effect synchronization over a wide range of frequencies during the period that the oscillator is being brought to the desired frequency. During the synchronization process, termed in the art as "pull-in," the voltages developed by the phase detector are of high intensity and of relatively high frequency. When the voltage developed in the phase detector output swings in a positive direction, the rectifier 14 becomes conductive imparting a positive charge to capacitor 16. When the voltage swings in a negative direction, the rectifier 15 becomes conductive imparting a negative charge to capacitor 17. After a short period, these oscillations of the control voltage develop a substantial potential difference between the capacitors 16 and 17. As these capacitors charge, one positive and one negative relative to the nominal D.C. output voltage of the control network 2′, the point is reached at which successive swings of the voltage will be substantially ineffective in overcoming the bias applied to the rectifiers by the capacitors 16 and 17. In this condition current flow through the diodes is substantially prevented, thereby effectively disconnecting the capacitors from the circuit and transforming the control network into a simple proportional network, which has an extended "pull-in" range. In this condition, synchronization of the oscillator is quickly achieved, causing extinguishment of the large potential swings indicative of non-synchronization and allowing the voltage differences between capacitors 16 and 17 to gradually disappear by current flow through the resistor 18 and by current flow through rectifiers 14 and 15, if rectifiers having back resistances are employed. When the two voltages across the capacitors become identical and substantially equal to the minimal direct current voltage indicative of synchronization, the two capacitors are again effective to supply substantial integration to the control voltage of noise pulses of any magnitude or of either polarity. By virtue of the relatively large energy capacity of the capacitors in comparison to the relatively low energy content of the noise pulses, the minute current flows occasioned by the noise pulses will create negligible disturbance in the output voltage of the control network. Since the "spike" shaped noise pulses are of considerably less energy content than the sawtooth shaped high frequency voltages developed during the synchronization period by the phase detector, the leakage rate between the capacitors 16 and 17 may be chosen so that the recurrent noise pulses are not in themselves effective to charge the capacitors to cause apparent disconnection of the integration capacitors.

During synchronous operation, because of the effective reconnection of the capacitors 16 and 17 into the control network, the control network 2′ may be treated as the simple "Proportional-Plus Integral Control Network" illustrated in Figure 1. The values of capacitors 16 and 17 may be chosen in much the same manner as the value of capacitor 10, and the values of resistors 8 and 9 of control network 2′ may be chosen in much the same manner as those of the corresponding components in control network 2. However, in the control network arrangement embodying the present invention, the values of the components in 2′ need not be compromised as is the case with control networks of the nature shown in Figure 1. Consequently, optimum component values may be chosen to provide maximum stability and noise immunity in control network 2′ without reduction in the synchronization range.

Referring now to Figure 3, there is shown in schematic diagram, a further embodiment of the invention. Elements corresponding to those illustrated in Figures 1 and 2 bear the same reference numerals in Figure 3. In Figure 3 there is shown a frequency control system including a phase detector shown at 1 of the type adapted to produce a direct current output voltage, indicative of the phase separation, when a short duration pulse and a sawtooth wave or sine wave are applied thereto, a filter network shown at 2″ adapted to eliminate high frequency noise pulses and to stabilize the control voltage supplied by the phase detector at 1, an output tube 39 and a voltage controlled oscillator 45. The output terminals of the oscillator 45 are coupled to a sawtooth wave generator whose frequency is controlled by the oscillator frequency. The output terminals of the sawtooth wave generator are then coupled to the phase detector 1 input.

Considering now in detail the phase detector and filtering arrangement of Figure 3, the phase detector 1 comprises a pair of reverse connected triodes 19 and 20 having their grids 21 and 22 connected together and to a capacitor 23 whose other terminal is connected to the ungrounded main input terminal 6. The cathode 24 of triode 19 is connected to the anode 25 of triode 20 and to one terminal of a resistor 26 whose other terminal is connected to the junction of grids 21 and 22 and capacitor 23. The anode 27 of the triode 19 and the cathode 28 of the triode 20 are also connected together, this junction being connected to the ungrounded input terminal of the filter 2″. The filter 2″ comprises a first capacitor 29 shunting the terminals of the filter 2″, a resistor 30 in series with a capacitor 31 shunting the terminals of the filter 2″, and a third circuit also shunting the terminals of the filter 2″. This last shunt circuit comprises a pair of capacitors 32 and 33, a pair of rectifiers 34 and 35 and a pair of resistors 36 and 37. One terminal of capacitor 32 is connected to the negative terminal of rectifier 34 and one terminal of capacitor 33 is connected to the positive terminal of rectifier 35. The positive terminal of rectifier 34 and the negative terminal of rectifier 35 are connected together and to the ungrounded terminal of the filter 2″. Resistors 36 and 37 are connected to shunt capacitors 32 and 33 respectively, and the terminals of said capacitors remote from said rectifiers are connected together and to the grounded terminal of filter 2″. The output terminal of filter 2″ is connected to the grid 38 and vacuum tube 39. The vacuum tube 39 has its anode 40 connected to a suitable source 42 of high voltage potential. The cathode 43 is coupled to a load resistance 44 having its other terminal connected to ground. The cathode 43, from which the output is taken, is then coupled to a voltage controlled oscillator 45. Output of the oscillator is fed to the main output terminals 7 and to the sawtooth wave generator 5, whose otuput is coupled to the cathode 24, of triode 19 and anode 25 of triode 20.

In operation the arrangement of Figure 3 resembles that of Figure 2. The phase detector illustrated in Figure 3, is one which may be substituted in Figure 2 as well. A variant form of filter 2′ has been illustrated in Figure 3. In filter 2″ the capacitor 29 is of relatively small value, and serves primarily to bypass the spurious spike-shaped waves generated in the "clamping" operation of phase detector 1. The proportional control portion of the network is inherent in the internal resistances of discharge devices 19 and 20. Resistor 30 and capacitor 31 constiute a fixed portion of integral control for stabilizing the automatic frequency control line.

The novel portion of the filter lies in the third shunting circuit. Here the rectifiers 34 and 35 serve to disconnect capacitors 32 and 33 during the "pull-in" in the manner described in connection with Figure 2. The capacitors 32 and 33 may have relatively large values on the order of from $\frac{1}{10}$ to even 10 microfarads depending upon the noise conditions expected. Resistors 36 and 37 may be of the order of 5 to 10 meghoms. In the arrangement of Figure 3, the minimal filtering is provided by capacitor 29 primarily and the maximum filtering is provided when the capacitors 32 and 33 are effectively in the filter circuit, with capacitor 29.

The invention is generally applicable to frequency control systems in which a stabilizing and noise eliminating filter is necessary for elimination of higher frequency components including both spurious low energy content periodic signals and random noise pulses from the control voltage and in which an increase in the filtering effect restricts the synchronization range. The manner of temporarily reducing the filtering effect during the "pull-in" period, here disclosed, may be carried out by the use of the simple and effective rectifier circuits illustrated in Figures 2 and 3. In such arrangements, either vacuum tube or dry disk rectifiers such as germanium rectifiers may be employed.

Other forms of external input signals as well as other forms of internally generated waves may be employed with other types of phase detectors. The particular phase detector of the kind illustrated in Figure 3 may also be used effectively with an externally supplied sinusoidal or sawtooth wave, while the internally supplied wave is of pulse wave form.

While particular embodiments of this invention have been shown and described, it will, of course, be apparent that various modifications may be made without departing from the invention. Therefore, by the appended claims, it is intended to cover all such changes and modifications as fall within the true spirit and scope of the present invention.

What I claim as new and desire to secure by Letters Patent of the United States is:

1. In a frequency control system in which tuning of an oscillator is achieved by use of a control voltage corresponding to the degree of detuning of said oscillator, which control voltage may contain undesired high frequency variations of low energy content, a filter for eliminating said higher frequency variations from the control voltage, and means sensitive to the energy content of waves applied thereto which are responsive to the high frequency fluctuations in the error voltage corresponding to a substantial tuning error and non-responsive to said undesired high frequency fluctuations for reducing the effectiveness of the filter during the period that the oscillator is being brought into tune.

2. A frequency control system comprising an oscillator, voltage responsive tuning means for said oscillator, means for producing a control voltage corresponding to the degree of detuning of said oscillator, which control voltage may contain undesired high frequency voltage variations of low energy content, filter means connected between said control voltage producing means and said tuning means providing a coupling which impedes the passage of high frequency voltage variations therethrough, and means responsive to the high frequency variations in error voltage of high energy content corresponding to a substantial tuning error and non-responsive to said undesired high frequency variations of low energy content for reducing the effectiveness of said filter during the period that the oscillator is being brought into tune.

3. A frequency control system comprising an oscillator, voltage responsive tuning means for said oscillator, means for producing a control voltage corresponding to the degree of detuning of said oscillator, which control voltage may contain high frequency voltage variations of high energy content during the period that the oscillator is being brought into tune, in addition to undesired high frequency voltage variations of low energy content, filter means having a pair of input and a pair of output terminals coupled respectively to said control voltage producing means and said tuning means, said filter means comprising a capacitor arranged to provide a shunting capacitance across the output terminals of said filter so as to attenuate high frequency variations, and means responsive to said high frequency variations in error voltage of high energy content and non-responsive to said undesired high frequency variations for reducing the effective capacitance supplied to said filter by said capacitor.

4. A frequency control system comprising an oscillator, voltage responsive tuning means for said oscillator, means for producing a control voltage corresponding to the degree of detuning of said oscillator, which control voltage may contain high frequency voltage variations of high energy content during the period that the oscillator is being brought into tune, in addition to undesired high frequency voltage variations of low energy content, filter means for impeding the passage of high frequency voltage variations therethrough, said filter means having a pair of input and a pair of output terminals coupled respectively to said control voltage producing means and said tuning means, said filter means including a resistance in series, between one of said input terminals and one of said output terminals, a pair of capacitors in shunt with said output terminals and rectifier means for effectively disconnecting said capacitors in the presence of high frequency waves of high energy content.

5. A frequency control system comprising an oscillator, voltage responsive tuning means for said oscillator, means for producing a control voltage corresponding to the degree of detuning of said oscillator, which control voltage may contain high frequency voltage variations of high energy content during the period that the oscillator is being brought into tune, in addition to undesired high frequency voltage variations of low energy content, filter means for impeding the passage of high frequency voltage variations therethrough, said filter means having a pair of input and a pair of output terminals coupled respectively to said control voltage producing means and said tuning means, said filter means including a circuit in shunt with said pair of output terminals, said circuit including a pair of capacitors and a pair of rectifiers for effectively disconnecting said capacitors in the presence of said high frequency waves of high energy content, one of said rectifiers being connected in one polarity in series with one of said capacitors, and the other of said rectifiers being connected in the reverse polarity in series with the other of said capacitors, said series circuits being connected in parallel with one another.

6. A frequency control system comprising an oscillator, voltage responsive tuning means for said oscillator, phase detector means for producing a control voltage corresponding to the degree of detuning of said oscillator, which control voltage may contain high frequency voltage variations of high energy content during the period that the oscillator is being brought into tune, in addition to undesired high frequency voltage variations of low energy content, filter means for impeding the passage of high frequency voltage variations therethrough, said filter means having a pair of input and a pair of output terminals coupled respectively to said phase detector means and said tuning means, said filter means including a resistance in series between one of said input and one of said output terminals and a circuit in shunt with said pair of output terminals including a pair of capacitors and a pair of rectifiers for effectively disconnecting said capacitors in the presence of high frequency waves of high energy content, one of said rectifiers being connected in one polarity in series with one of said capacitors, and the other of said rectifiers being connected in the reverse polarity in series with the other of said capacitors, said series circuits being connected in parallel with one another.

7. A frequency control system comprising an oscillator, voltage responsive tuning means for said oscillator, phase detector means for producing a control voltage corresponding to the degree of detuning of said oscillator, which control voltage may contain high frequency voltage variations of high energy content during the period that the oscillator is being brought into tune, in addition to undesired high frequency voltage variations of low energy content, filter means for impeding the passage of high frequency voltage variations therethrough, said filter means having a pair of input and a pair of output terminals coupled respectively to said phase detector means and said tuning means, said filter means including a circuit in shunt with said pair of output terminals including a pair of capacitors, a pair of rectifiers for effectively disconnecting said capacitors in the presence of high frequency waves of high energy content and a resistance, one of said rectifiers being connected in one polarity in series with one of said capacitors and the other of said rectifiers being connected in the reverse polarity with the other of said capacitors, said two series circuits so formed being connected in parallel with one another and in series with said resistance to form said shunt circuit.

8. A frequency control system comprising an oscillator, voltage responsive tuning means for said oscillator, phase detector means for producing a control voltage corresponding to the degree of detuning of said oscillator, which control voltage may contain high frequency voltage variations of high energy content during the period that the oscillator is being brought into tune, in addition to undesired high frequency voltage variations of low energy content, filter means for impeding the passage of high frequency voltage variations therethrough, said filter means having a pair of input and a pair of output terminals coupled respectively to said phase detector means and said tuning means, said filter means including a first resistance connected in series between an input terminal and an output terminal, a circuit in shunt with said pair of output terminals including a pair of capacitors, a pair of rectifiers for effectively disconnecting said capacitors in the presence of high frequency waves of high energy content and a second resistance, one of said rectifiers being connected in one polarity in series with one of said capacitors and the other of said rectifiers being connected in the reverse polarity with the other of said capacitors, said two series circuits so formed being connected in parallel with one another and in series with said second resistance to form said shunt circuit.

9. A frequency control system comprising an oscillator, voltage responsive tuning means for said oscillator, phase detector means for producing a control voltage corresponding to the degree of detuning of said oscillator, which control voltage may contain high frequency voltage variations of high energy content during the period that the oscillator is being brought into tune, in addition to undesired high frequency voltage variations of low energy content, filter means for impeding the passage of high frequency voltage variations therethrough, said filter means having a pair of input and a pair of output terminals coupled respectively to said phase detector means and said tuning means, said filter means including a circuit in shunt with said pair of output terminals including a pair of capacitors and means for effectively disconnecting said capacitors in the presence of high frequency waves of high energy content including a pair of rectifiers and a resistance, one of said rectifiers being connected in one polarity in series with one of said capacitors, the other of said rectifiers being connected in the reverse polarity in series with the other of said capacitors, said series circuits being connected in parallel with one another and said resistance being connected between the junctions of said capacitors and said rectifiers.

10. A frequency control system comprising an oscillator, voltage responsive tuning means for said oscillator, phase detector means for producing a control voltage corresponding to the degree of detuning of said oscillator, which control voltage may contain high frequency voltage variations of high energy content during the period that the oscillator is being brought into tune, in addition to undesired high frequency voltage variations of low energy content, filter means for impeding the passage of high frequency voltage variations therethrough, said filter means having a pair of input and a pair of output terminals coupled respectively to said phase detector means and said tuning means, said filter means including a first capacitor shunting said output terminals and a second circuit shunting said output terminals including a pair of capacitors and a pair of rectifiers for effectively disconnecting said capacitors in the presence of high frequency waves of high energy content, one of said rectifiers being connected in one polarity in series with one of said capacitors, and the other of said rectifiers being connected in the reverse polarity in series with the other of said capacitors, said series circuits being connected in parallel with one another.

11. A frequency control system comprising an oscillator, voltage responsive tuning means for said oscillator, means for producing a control voltage corresponding to the degree of detuning of said oscillator, which control voltage may contain undesired high frequency voltage variations of low energy content, filter means connected between said control voltage producing means and said tuning means providing a coupling which impedes the passage of high frequency voltage variations therethrough, and means sensitive to the energy content of waves applied thereto which are responsive to the high frequency variations in error voltage corresponding to a substantial tuning error and non-responsive to said undesired high frequency variations for reducing the effectiveness of said filter during the period that the oscillator is being brought into tune.

12. A frequency control system comprising an oscillator, voltage responsive tuning means for said oscillator, means for producing a control voltage corresponding to the degree of detuning of said oscillator, which control voltage may contain high frequency voltage variations of high energy content during the period that the oscillator is being brought into tune, in addition to undesired high frequency voltage variations of low energy content, filter means having a pair of input and a pair of output terminals coupled respectively to said control voltage producing means and said tuning means, said filter means comprising a capacitor arranged to provide a shunting capacitance across the output terminals of said filter so as to attenuate higher variations, and means sensitive to the energy content of waves applied thereto which are responsive to said high frequency variations in error voltage corresponding to a substantial tuning error and non-responsive to said undesired high frequency variations for reducing the effective capacitance supplied to said filter by said capacitor.

13. A frequency control system comprising an oscillator, voltage responsive tuning means for said oscillator, means for producing a control voltage corresponding to the degree of detuning of said oscillator, a low pass filter connected between said control voltage producing means and said tuning means comprising a first unilaterally conducting path including a first capacitance means connected in circuit therewith, a second unilaterally conducting path oppositely poled wtih respect to said first path including a second capacitance means, said capacitance means being connected to exert a smoothing effect upon fluctuations of either polarity in said control voltage from its average value in an amount depending upon the condition of charge of said capacitances.

14. A frequency control system comprising an oscillator, voltage responsive tuning means for said oscillator, means for producing a control voltage corresponding to the degree of detuning of said oscillator, a low pass filter connected between said control voltage producing means and said tuning means comprising a first unilaterally conducting path including a first capacitance means connected in circuit therewith, a second unilaterally conducting path oppositely poled with respect to said first path including a second capacitance means, said capacitance means being connected to exert a smoothing effect upon fluctuations of either polarity in said control voltage from its average value in an amount depending upon the condition of charge of said capacitances, said paths permitting rapid charging of said capacitances to potentials diverse from said average value when variations in control voltage corresponding to a tuning error appear and a discharging circuit for gradually discharging each of said capacitances to potentials of said average value.

15. A frequency control system comprising an oscillator, voltage responsive tuning means for said oscillator, means for producing a control voltage corresponding to the degree of detuning of said oscillator, which voltage may contain undesired high frequency voltage variations, a transfer network connected between said control voltage producing means and said tuning means having two conditions of operation, one of said conditions of operation permitting the passage of a given band of frequencies, and the other of said conditions of operation permitting the passage of said band less the higher frequency portion thereof so as to eliminate said undesired voltage variations from said control voltage, and means for placing said transfer network in said one condition of operation during the period that the oscillator is being brought into tune.

16. A frequency control system comprising an oscillator, voltage responsive tuning means for said oscillator, means for producing a control voltage corresponding to the degree of detuning of said oscillator, which voltage may contain undesired high frequency voltage variations, a transfer network connected between said control voltage producing means and said tuning means stabilizing the voltage at said tuning means and having two conditions of operation, one of said conditions of operation permitting the passage of a given band of frequencies, and the other of said conditions of operation permitting the passage of said band less the higher frequency portion thereof so as to eliminate said undesired voltage variations from said control voltage, and means responsive to a control voltage corresponding to a substantial tuning error for placing said transfer network in said one condition of operation during the period that the oscillator is being brought into tune.

17. An automatic frequency control system comprising, in combination, a phase detector adapted to receive synchronizing signals, an oscillator to be synchronized with said signals, a circuit for coupling a signal indicative of the phase of said oscillator to said phase detector, a control device coupled to said oscillator and adapted to control its frequency in response to an error voltage, a transfer network connected between the output of said phase detector and the input of said control device so as to couple at least portions of the error voltage appearing at the output of said phase detector to the input of said control device, said transfer circuit having first and second conditions of operation, said first condition of operation being such that a given band of frequencies appearing at the output of said phase detector are coupled to said control device, said second condition of operation being such that a band of frequencies less than said given band is coupled from the output of said phase detector to said control device, said transfer circuit having circuit components for changing the condition of operation of said transfer network from said first condition to said second condition of operation after a synchronous condition is established, said latter circuit having an operating characteristic such that it is prevented from causing a reversion from the second condition of operation to the first condition until the average energy of the signals applied to it is above a predetermined level.

18. An automatic frequency control system that operates in a wide band condition during pull-in and in a narrow band condition even in the presence of relatively large amounts of noise comprising an oscillator, phase detecting means, a circuit for coupling the output of said oscillator to said phase detecting means, a frequency control device coupled to said oscillator, said phase detecting means being adapted to receive synchronizing signals and to produce a beat between the output of said oscillator and the synchronizing signal, a transfer network coupled between said phase detecting means and said control device, said transfer network including means for shifting the bandwidth of said transfer network from a wide frequency spectrum to a relatively narrow band spectrum, said shifting means being operative to make the shift from a wide frequency spectrum to a narrow frequency spectrum in response to an output of said phase detecting means that is produced when the oscillator is in synchronism.

References Cited in the file of this patent

UNITED STATES PATENTS

| | | |
|---|---|---|
| 2,560,312 | Tellier | July 10, 1951 |
| 2,563,816 | Butman | Aug. 14, 1951 |
| 2,588,094 | Eaton | Mar. 4, 1952 |
| 2,676,262 | Hugenholtz | Apr. 20, 1954 |
| 2,730,614 | Wheeler | Jan. 10, 1956 |
| 2,763,779 | DeGroot et al. | Sept. 18, 1956 |